United States Patent
Kim et al.

(10) Patent No.: US 8,975,689 B1
(45) Date of Patent: Mar. 10, 2015

(54) SEMICONDUCTOR APPARATUS HAVING VERTICAL CHANNEL TRANSISTOR AND METHOD OF FABRICATING THE SAME

(71) Applicant: SK hynix Inc., Gyeonggi-do (KR)

(72) Inventors: Min Seok Kim, Gyeonggi-do (KR); Hyo Seob Yoon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/157,255

(22) Filed: Jan. 16, 2014

(30) Foreign Application Priority Data

Sep. 30, 2013 (KR) .................. 10-2013-0116514

(51) Int. Cl.
| | |
|---|---|
| H01L 29/66 | (2006.01) |
| H01L 21/336 | (2006.01) |
| H01L 45/00 | (2006.01) |
| H01L 27/24 | (2006.01) |

(52) U.S. Cl.
CPC ...... *H01L 29/66666* (2013.01); *H01L 45/1608* (2013.01); *H01L 27/2454* (2013.01); *H01L 29/66* (2013.01)
USPC .......................................... 257/329; 438/268

(58) Field of Classification Search
USPC .......................................... 257/329; 438/268
See application file for complete search history.

(56) References Cited

U.S. PATENT DOCUMENTS

2011/0223731 A1* 9/2011 Chung et al. .................. 438/270

FOREIGN PATENT DOCUMENTS

| KR | 1020100008557 | 1/2010 |
|---|---|---|
| KR | 101094377 | 12/2011 |

* cited by examiner

*Primary Examiner* — David Vu
*Assistant Examiner* — Brandon Fox
(74) *Attorney, Agent, or Firm* — IP & T Group LLP (57) ABSTRACT

A semiconductor apparatus and a method of fabricating the same are provided. The method includes sequentially depositing a gate electrode material and a sacrificial insulating layer on a semiconductor substrate, patterning the gate electrode material and the sacrificial insulating layer to form one or more holes exposing a surface of the semiconductor substrate, forming a gate insulating layer on an inner sidewall of the hole, forming one or more pillar patterns each filled in the hole and recessed on a top thereof, forming a contact unit and an electrode unit on the pillar pattern, removing a patterned sacrificial insulating layer and forming a spacer nitride material on the semiconductor substrate from which the patterned sacrificial insulating layer is removed, and removing portions of the spacer nitride material and a patterned gate electrode material between the pillar patterns.

20 Claims, 13 Drawing Sheets

SEMICONDUCTOR APPARATUS HAVING VERTICAL CHANNEL TRANSISTOR AND METHOD OF FABRICATING THE SAME

CROSS-REFERENCES TO RELATED APPLICATION

This application claims priority under 35 U.S.C. 119(a) to Korean application No. 10-2013-0116514, filed on Sep. 30, 2013, in the Korean intellectual property Office, which is incorporated by reference in its entirety.

BACKGROUND

1. Technical Field

Various embodiments of the inventive concept relate to a semiconductor apparatus, and more particularly, to a semiconductor apparatus having a vertical channel transistor and a method of fabricating the same.

2. Related Art

As an integration degree of semiconductor apparatuses is becoming higher, a two-dimensional area for each unit cell is reduced. With respect to the reduction in the area of the unit cell, various research has been conducted. For example, connection members, such as contact units, for connecting switching devices, bit lines, word lines, and capacitors are fabricated in a buried form.

As part of an effort, vertical channel semiconductor apparatuses are suggested wherein sources and drains of MOS transistors used for switching devices are arranged vertically or three-dimensionally with respect to a substrate surface to induce vertical channels to a substrate.

In vertical channel transistors, the vertical channel is induced by including a pillar pattern perpendicular to a semiconductor substrate, a gate electrode formed on an outer circumference of the pillar pattern, and a source and a drain formed on upper and lower ends of the pillar pattern with the gate electrode therebetween.

The vertical channel transistor is advantageous in that an area of the transistor on the substrate is not increased even when a channel length is increased. However, the manufacturing process of the vertical transistor is very complex since the pillar pattern is formed, and then the gate electrode is formed to surround the outer circumference of the pillar pattern.

More specifically, the vertical channel transistor is manufactured by etching a substrate, in which a pillar is formed, to recess a lower portion of the pillar by a preset width, forming a gate insulating layer on the substrate in which the pillar is formed, depositing a conductive layer for a surrounding gate electrode on the semiconductor substrate in which the gate insulating layer is formed, and spacer-etching the deposited conductive layer to form the surrounding gate electrode surrounding the recessed lower portion of the pillar.

Since the lower portion of the pillar is recessed to form the surrounding gate electrode, a width of the lower portion of the pillar is smaller than that of an upper portion of the pillar, and thus collapse of the pillar pattern occurs.

Further, when the conductive layer deposited to form the surrounding gate electrode is spacer-etched, the conductive layer is not clearly etched, and the pillar patterns are not separated. Therefore, reliability of the semiconductor apparatus may be degraded.

SUMMARY

Various exemplary embodiments of the present invention are provided to a semiconductor apparatus having a vertical channel transistor capable of improving reliability thereof by preventing pillar patterns from being collapsed or being stuck, and a method of fabricating the same.

According to an exemplary embodiment of the present invention, there is provided a method of fabricating a semiconductor apparatus, the method may include: sequentially depositing a gate electrode material and a sacrificial insulating layer on a semiconductor substrate, patterning the gate electrode material and the sacrificial insulating layer to form one or more holes exposing a surface of the semiconductor substrate, forming a first gate insulating layer on an inner sidewall of the hole, forming one or more pillar patterns each filled in the hole and recessed on a top thereof, forming a contact unit and an electrode unit on the pillar pattern, removing a patterned sacrificial insulating layer and forming a spacer nitride material on the semiconductor substrate from which the patterned sacrificial insulating layer is removed, and removing portions of the spacer nitride material and a patterned gate electrode material between the pillar patterns.

According to an aspect of another exemplary embodiment of the present invention, there is provided a method of fabricating a semiconductor apparatus, the method may include: sequentially depositing a gate electrode material and an insulating layer on a semiconductor substrate, patterning the gate electrode material and the insulating layer to form one or more holes exposing a surface of the semiconductor substrate, forming a gate insulating layer on an inner sidewall of the hole, forming one or more pillar patterns each filled in the hole and recessed on a top thereof, forming a contact unit and an electrode unit on the pillar pattern, recessing the electrode unit and forming a data storage unit filled in the hole, and removing a portion of a patterned gate electrode material between the pillar patterns.

According to an aspect of further exemplary embodiment of the present invention, there is provided a semiconductor apparatus that may include: a semiconductor substrate into which ions are implanted, one or more pillar patterns formed on and extending upward from the semiconductor substrate, a gate electrode material formed on an outer sidewall of the pillar pattern with a set height, a first gate insulating layer formed between the gate electrode material and the pillar pattern in a straight form, and a spacer nitride material formed on the gate electrode material to enclose the pillar pattern.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form as long as it is not specifically mentioned in a sentence.

Although a few embodiments of the inventive concept will be shown and described, it will be appreciated by those of ordinary skill in the art that changes may be made in these exemplary embodiments without departing from the principles and spirit of the inventive concept.

FIGS. 1A to 1H are cross-sectional views illustrating a method of manufacturing a semiconductor apparatus according to an embodiment of the inventive concept.

Figure 1A:
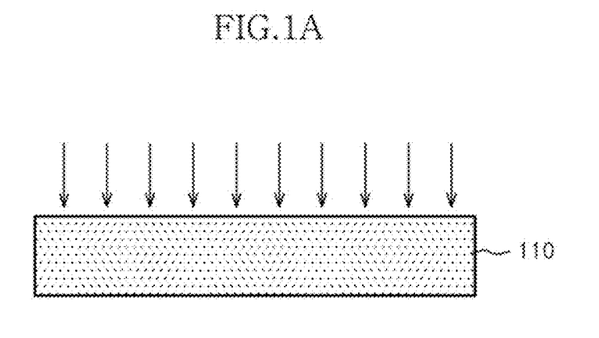
FIGS. 1A to 1H are cross-sectional views illustrating a method of manufacturing a semiconductor apparatus according to an embodiment of the inventive concept.

As illustrated in FIG. 1A, a method of manufacturing a semiconductor apparatus according to an embodiment of the inventive concept may include providing a semiconductor substrate 110 and implanting ions for preventing a pattern from being collapsed into the semiconductor substrate 110. The ions for preventing the pattern from being collapsed may be, for example, nitrogen ions ($N^+$).

Figure 1B:
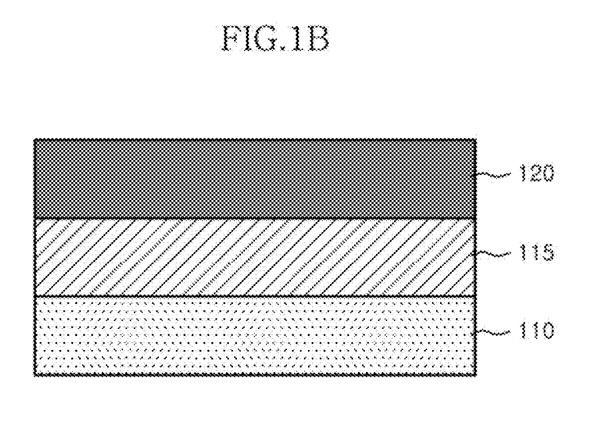

As illustrated in FIG. 1B, a gate electrode material 115 is deposited on the semiconductor substrate 110, and a sacrificial insulating layer 120 is deposited on the gate electrode material 115. The gate electrode material 115 may include, for example, a titanium nitride (TiN) layer, a tantalum nitride (TaN) layer, a tungsten (W) layer, or a titanium silicide ($TiSi_2$) layer, and the sacrificial insulating layer 120 may be an oxide layer. A stacking height of the gate electrode material 115 and the sacrificial insulating layer 120 may be determined by considering a thickness of the gate electrode material 115 to be removed in a subsequent process and a total height of a vertical channel transistor.

Figure 1C:
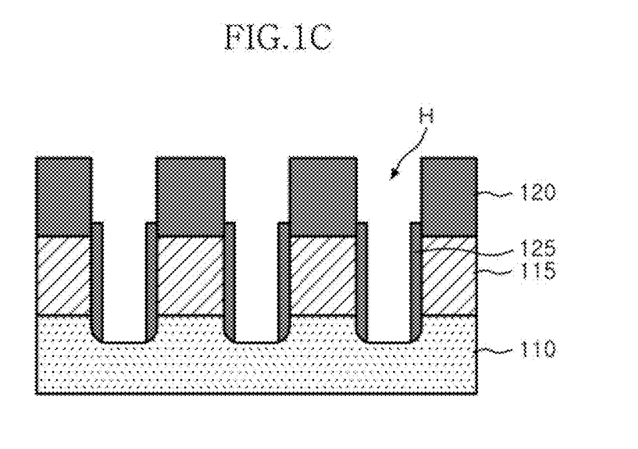

As illustrated in FIG. 1C, the gate electrode material 115 and the sacrificial insulating layer 120 are patterned to form a hole H exposing an upper surface of the semiconductor substrate 110, and a gate insulating layer 125 is deposited in the hole H. At this time, the gate electrode material 115 and the sacrificial insulating layer 120 may be patterned to expose the upper surface of the semiconductor substrate 110. Alternatively, as illustrated in FIG. 1C, the gate electrode material 115 and the sacrificial insulating layer 120 may be patterned from the upper surface of the semiconductor substrate 110 so that the semiconductor substrate is recessed by a certain depth. Further, the gate insulating layer 125 may be an oxide layer, and it may be deposited using an atomic layer deposition (ALD) method. Next, the gate insulating layer 125 is etched to be formed only on an inner sidewall of the hole H and to expose a bottom of the hole H. In other words, the gate insulating layer 125 may be formed on the inner sidewall of the hole H corresponding to a sidewall of the gate electrode material 115.

Figure 1D:
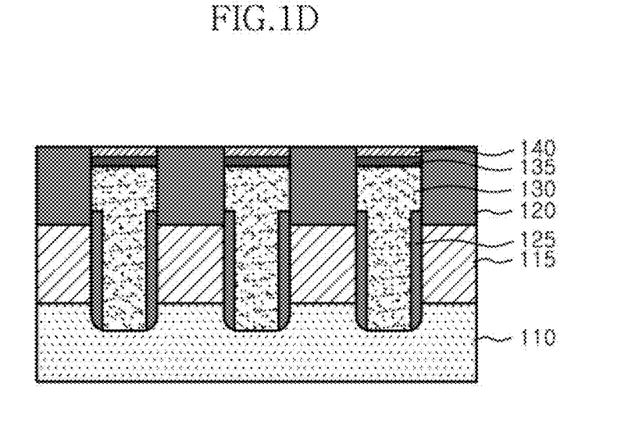

As illustrated in FIG. 1D, a pillar material is formed to be buried in the hole H through an epitaxial growth method, and then planarized to form an active pillar pattern 130. The active pillar pattern 130 is recessed by a certain depth, and a contact unit 135 is formed on the recessed active pillar pattern 130. An electrode unit 140 is formed on the contact unit 135. The contact unit 135 may be formed of, for example, silicide, and the electrode unit 140 may be formed of the same material as the gate electrode material 115. Since the active pillar pattern 130 is formed through an epitaxial growth method, collapse of the active pillar pattern 130 may be prevented. Further, since the contact unit 135 and the electrode unit 140 are formed after the active pillar pattern 130 is formed through an epitaxial growth method and then recessed by the certain depth, the manufacturing process may be simplified further without such a hard mask process.

Figure 1E:
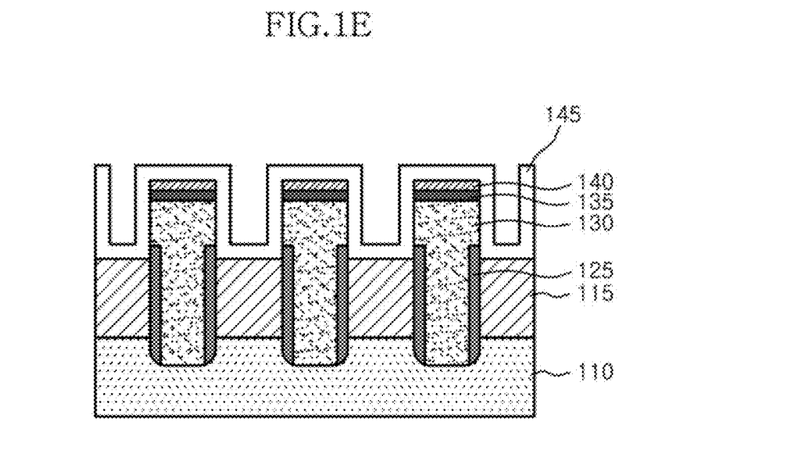

As illustrated in FIG. 1E, the sacrificial insulating layer 120 is removed from the semiconductor substrate through a dip out process. Next, a spacer nitride material 145 is formed on the upper surface of the semiconductor substrate from which the sacrificial insulating layer 120 is removed.

Figure 1F:
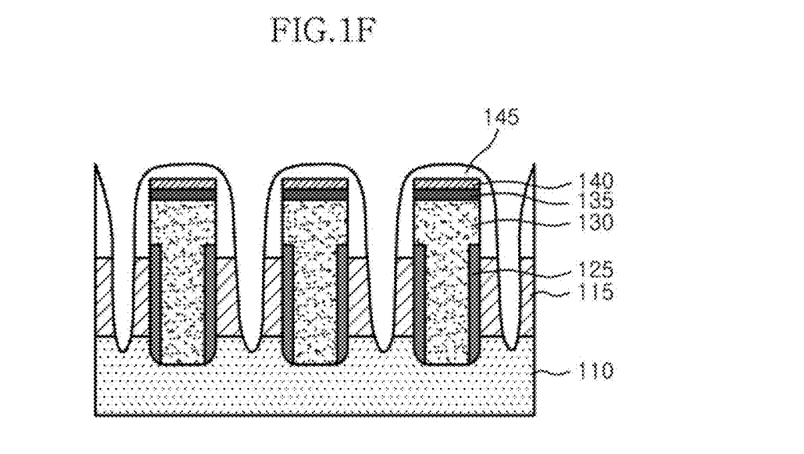

As illustrated in FIG. 1F, portions of the spacer nitride material 145 and the gate electrode material 115 that are spaced from an outer circumference of the active pillar pattern 130 by a preset distance, are etched.

Figure 1G:
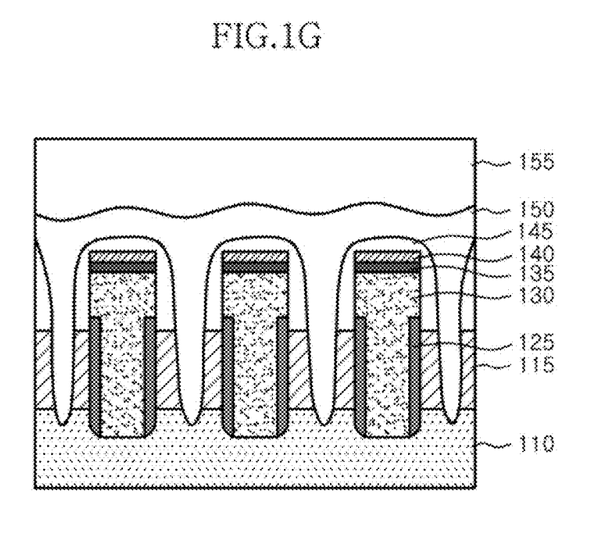

As illustrated in FIG. 1G, an insulating layer 150 for cell separation is formed on the semiconductor substrate, from which the portions of the spacer nitride material 145 and the gate electrode material 115 are etched, by a certain height, and a sacrificial layer 155 is formed on the insulating layer 150. The insulating layer 150 may be, for example, a nitride layer, and the sacrificial layer 155 may be, for example, a spin on dielectric (SOD) layer.

Figure 1H:
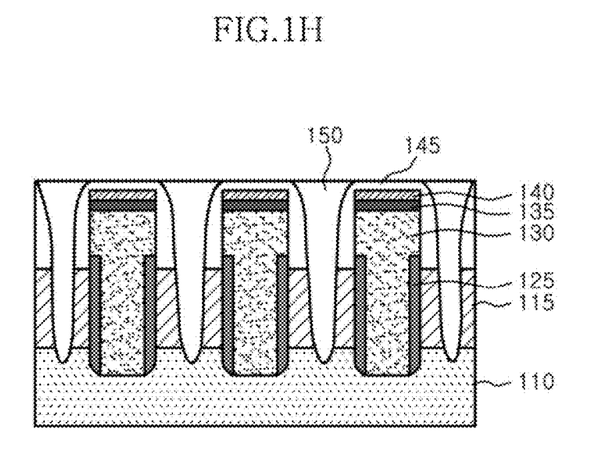

As illustrated in FIG. 1H, a portion of the insulating layer 150 and the sacrificial layer 155 are removed through a chemical mechanical polishing (CMP) process so that the insulating layer 150 is planarized.

FIGS. 2A to 2I are cross-sectional views illustrating a method of manufacturing a semiconductor apparatus according to an embodiment of the inventive concept.

Figure 2A:
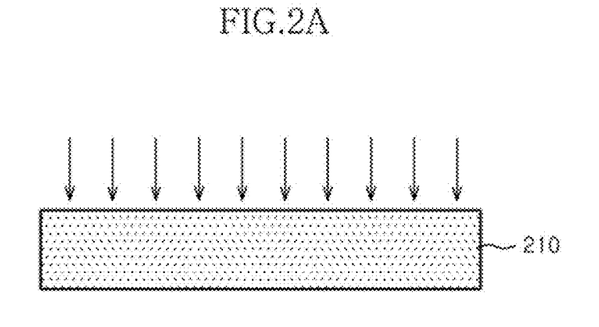
FIGS. 2A to 2I are cross-sectional views illustrating a method of manufacturing a semiconductor apparatus according to an embodiment of the inventive concept.

As illustrated in FIG. 2A, a method of manufacturing a semiconductor apparatus according to an embodiment of the inventive concept may include providing a semiconductor substrate 210 and implanting ions for preventing a pattern from being collapsed into the semiconductor substrate 210. The ions for preventing the pattern from being collapsed may be, for example, nitrogen ions ($N^+$).

Figure 2B:
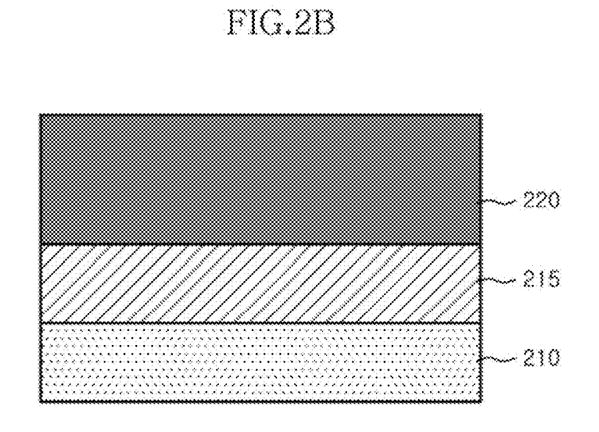

As illustrated in FIG. 2B, a gate electrode material 215 is deposited on the semiconductor substrate 210, and a sacrificial insulating layer 220 is deposited on the gate electrode material 215. The gate electrode material 215 may include, for example, a titanium nitride (TiN) layer, a tantalum nitride (TaN) layer, a tungsten (W) layer, or a titanium silicide ($TiSi_2$) layer, and the sacrificial insulating layer 220 may be an oxide layer. The process of FIG. 2B is different from the process of FIG. 1B in that a stacking height of the sacrificial insulating layer 220 may be different from that of the sacrificial insulating layer 120. A stacking height of the gate electrode material 215 and the sacrificial insulating layer 220 may be determined by considering a thickness of the gate electrode material 215 to be removed in a subsequent process and a total height of a vertical channel transistor.

Figure 2C:
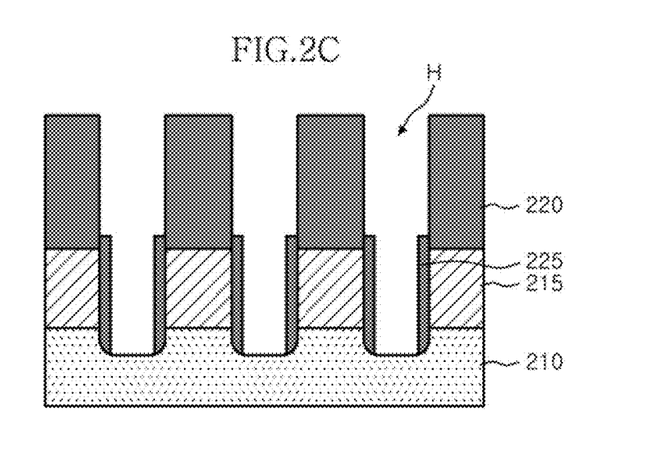

As illustrated in FIG. 2C, the gate electrode material 215 and the sacrificial insulating layer 220 are patterned to form a hole H exposing an upper surface of the semiconductor substrate 210, and a gate insulating layer 225 is deposited in the hole H. At this time, the gate insulating layer 225 may be an oxide layer, and it may be deposited using an atomic layer deposition (ALD) method. Next, the gate insulating layer 225 is etched to be formed only on an inner sidewall of the hole H and to expose a bottom of the hole H. In other words, the gate insulating layer 225 may be formed on the inner sidewall of the hole H corresponding to a sidewall of the gate electrode material 215.

Figure 2D:
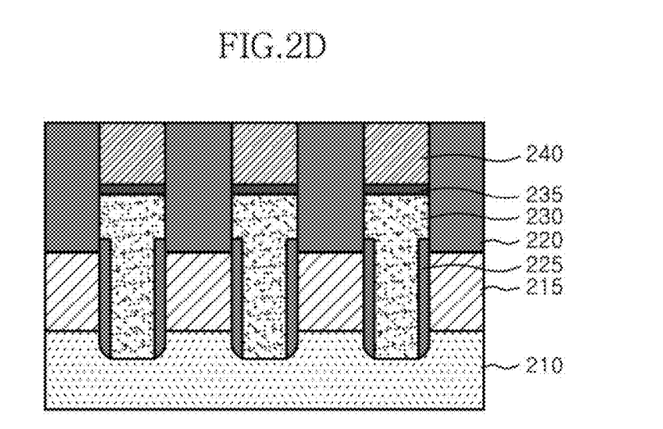

As illustrated in FIG. 2D, a pillar material is formed to be buried in the hole H through an epitaxial growth method, and then planarized to form an active pillar pattern 230. The active pillar pattern 230 is recessed by a certain depth, and a contact unit 235 is formed on the recessed active pillar pattern 230. An electrode unit 240 is formed on the contact unit 235. The contact unit 235 may be formed of, for example, silicide, and the electrode unit 240 may be formed of the same material as the gate electrode material 215. Since the active pillar pattern 230 is formed through an epitaxial growth method, collapse of the active pillar pattern 230 may be prevented. Further, since the contact unit 235 and the electrode unit 240 are formed after the active pillar pattern 230 is formed through an epitaxial growth method and then recessed by the certain depth, the manufacturing process may be simplified further without such a hard mask process.

Figure 2E:
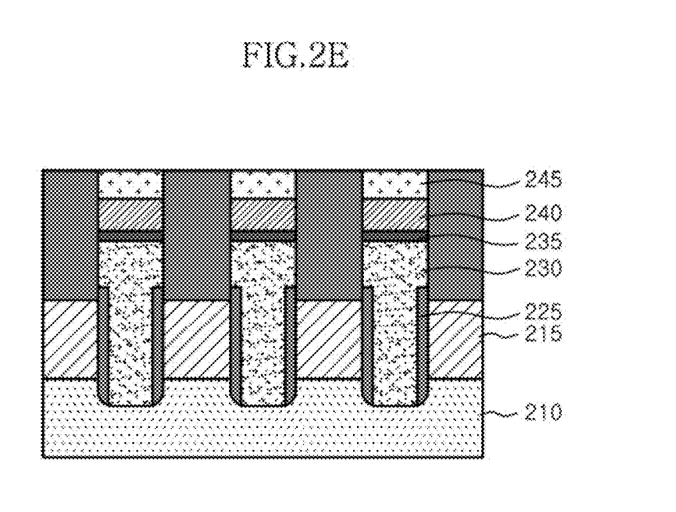

As illustrated in FIG. 2E, the electrode unit 240 is recessed by a certain depth, and a data storage unit 245 is formed on the recessed electrode unit 240 to be buried in the hole H. The data storage unit 245 may include a phase-change material, transition metal oxide, perovskite, or a polymer.

Figure 2F:
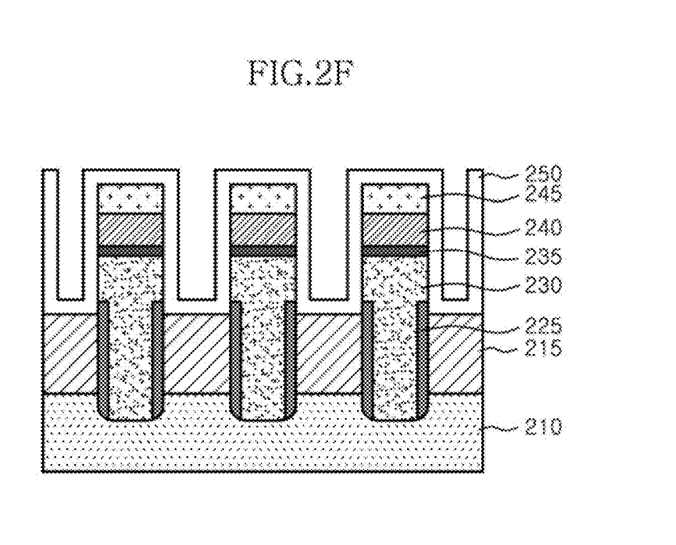

As illustrated in FIG. 2F, the sacrificial insulating layer 220 is removed from the semiconductor substrate through a dip out process. Next, a spacer nitride material 250 is formed on the upper surface of the semiconductor substrate from which the sacrificial insulating layer 220 is removed. The spacer nitride material 250 may be, for example, nitride.

Figure 2G:
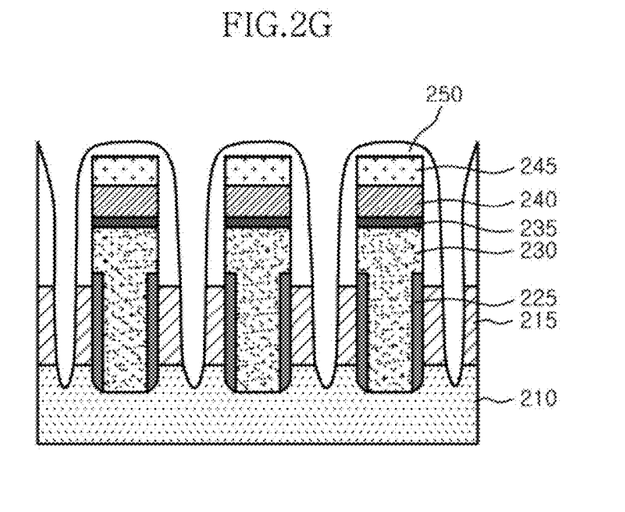

As illustrated in FIG. 2G, portions of the spacer nitride material 250 and the gate electrode material 215 that are spaced from an outer circumference of the active pillar pattern 230 by a preset distance, are etched.

Figure 2H:
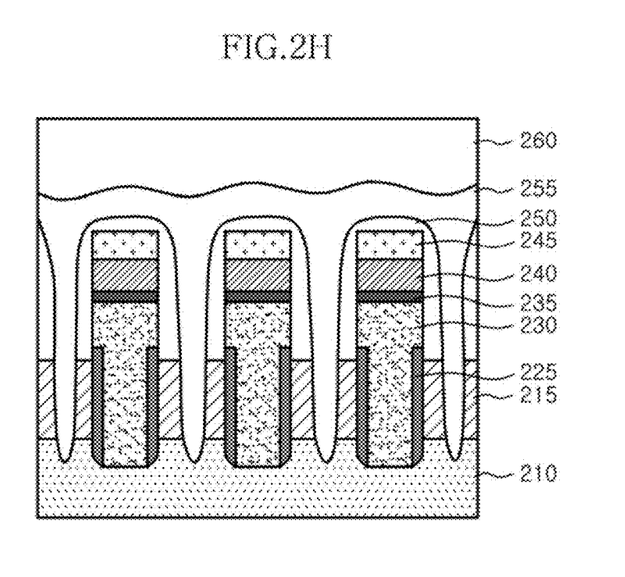

As illustrated in FIG. 2H, an insulating layer 255 for cell separation is formed on the semiconductor substrate, from which the portions of the spacer nitride material 250 and the gate electrode material 215 are etched, by a certain height, and a sacrificial layer 260 is formed on the insulating layer 255. The insulating layer 255 may be, for example, a nitride layer, and the sacrificial layer 260 may be, for example, a spin on dielectric (SOD) layer.

Figure 2I:
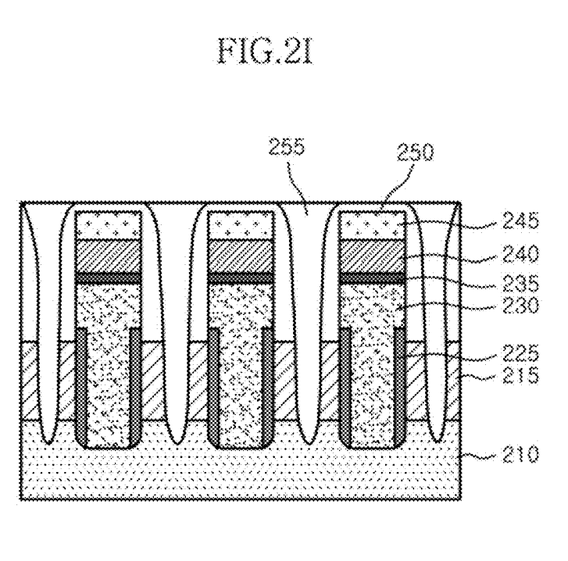

As illustrated in FIG. 2I, a portion of the insulating layer 255 and the sacrificial layer 260 are removed through a chemical mechanical polishing (CMP) process so that the insulating layer 255 is planarized.

FIGS. 3A to 3H are cross-sectional views illustrating a method of manufacturing a semiconductor apparatus according to an embodiment of the inventive concept.

Figure 3A:
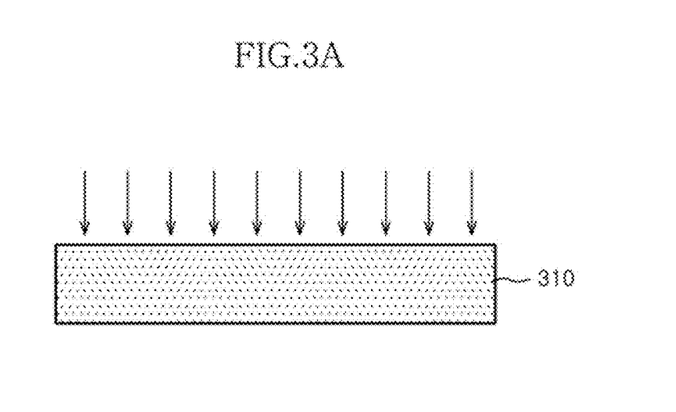
FIGS. 3A to 3H are cross-sectional views illustrating a method of manufacturing a semiconductor apparatus according to an embodiment of the inventive concept.

As illustrated in FIG. 3A, a method of manufacturing a semiconductor apparatus according to an embodiment of the inventive concept may include providing a semiconductor substrate 310 and implanting ions for preventing a pattern from being collapsed into the semiconductor substrate 310. The ions for preventing the pattern from being collapsed may be, for example, nitrogen ions ($N^+$).

Figure 3B:
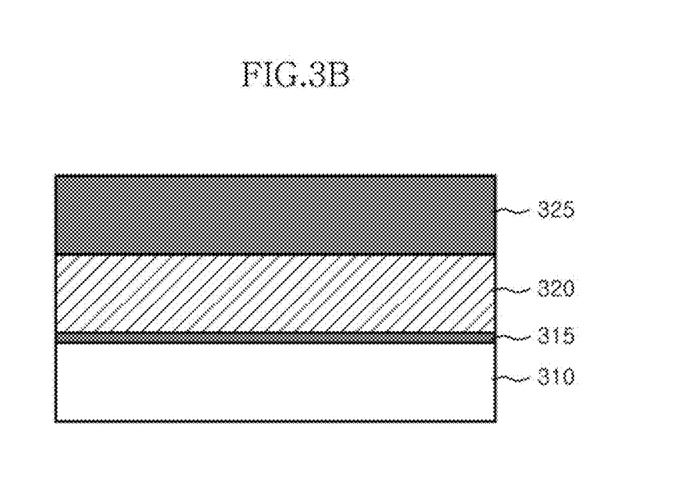

As illustrated in FIG. 3B, a first gate insulating layer 315 is deposited on the semiconductor substrate 310, a gate electrode material 320 is deposited on the first gate insulating layer 315, and a sacrificial insulating layer 325 is deposited on the gate electrode material 320. The gate electrode material 320 may include, for example, a titanium nitride (TiN) layer, a tantalum nitride (TaN) layer, a tungsten (W) layer, or a titanium silicide ($TiSi_2$) layer, and the sacrificial insulating layer 325 and the first gate insulating layer 315 may be formed of the same material, for example, an oxide layer. The first gate insulating layer 315 may be formed to reduce leakage current. As a thickness of the first gate insulating layer 315 is increased, the leakage current may be further reduced. A stacking height of the gate electrode material 320 and the sacrificial insulating layer 325 may be determined by considering a thickness of the gate electrode material 320 to be removed in a subsequent process and a total height of a vertical channel transistor.

Figure 3C:
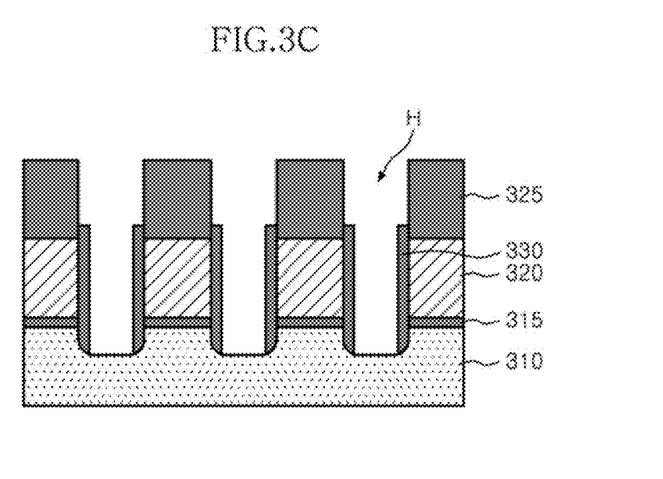

As illustrated in FIG. 3C, the first gate insulating layer 315, the gate electrode material 320, and the sacrificial insulating layer 325 are patterned to form a hole H exposing an upper surface of the semiconductor substrate 310, and a second gate insulating layer 330 is deposited in the hole H. At this time, the first gate insulating layer 315, the gate electrode material 320, and the sacrificial insulating layer 325 may be patterned to expose the upper surface of the semiconductor substrate 310. Alternatively, as illustrated in FIG. 3C, the first gate insulating layer 315, the gate electrode material 320, and the sacrificial insulating layer 325 may be patterned from the upper surface of the semiconductor substrate 310 so that the semiconductor substrate is recessed by a certain depth. Further, the second gate insulating layer 330 and the first gate insulating layer 315 may be formed of the same material, for example, an oxide layer, and the second gate insulating layer 330 may be deposited using an atomic layer deposition (ALD) method. Next, the second gate insulating layer 330 is etched to be formed only on an inner sidewall of the hole H and to expose a bottom of the hole H.

Figure 3D:
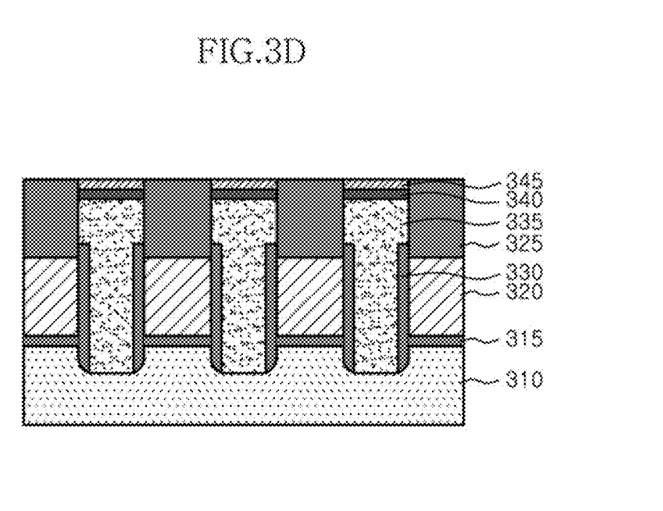

As illustrated in FIG. 3D, a pillar material is formed to be buried in the hole through an epitaxial growth method, and then planarized to form an active pillar pattern 335.

The active pillar pattern 335 is recessed by a certain depth, and a contact unit 340 is formed on the recessed active pillar pattern 335. An electrode unit 345 is formed on the contact unit 340. The active pillar pattern 335 may be recessed in an X-direction or a Y-direction. Therefore, the active pillar pattern 335 may be modified so that a gate current flows in one line direction, and resistance of the active pillar pattern 335 may be reduced since the active pattern is recessed in one line direction of the X-line direction and the Y-line direction. The contact unit 340 may be formed of, for example, silicide, and the electrode unit 345 may be formed of the same material as the gate electrode material 320. Since the active pillar pattern 335 is formed through an epitaxial growth method, collapse of the active pillar pattern 335 may be prevented. Further, since the contact unit 340 and the electrode unit 345 are formed after the active pillar pattern 335 is formed through an epitaxial growth method and then recessed by the certain depth, the manufacturing process may be simplified further without such a hard mask process. Although not shown in FIGS. 3A to 3D, a data storage unit may be formed on the electrode unit 345 as illustrated in FIG. 2E.

Figure 3E:
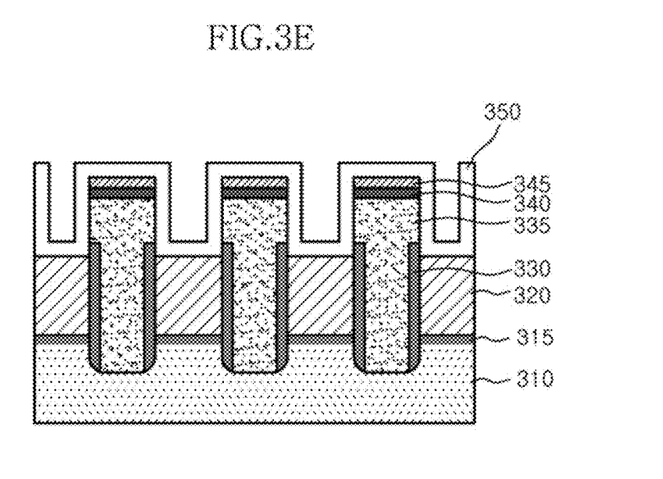

As illustrated in FIG. 3E, the sacrificial insulating layer 325 is removed from the semiconductor substrate through a dip out process. Next, a spacer nitride material 350 is formed on the upper surface of the semiconductor substrate from which the sacrificial insulating layer 325 is removed.

Figure 3F:
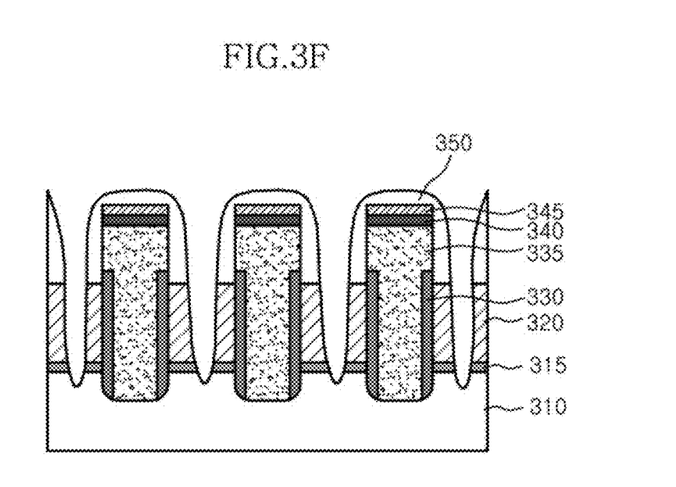

As illustrated in FIG. 3F, portions of the spacer nitride material 350 and the gate electrode material 320 that are spaced from an outer circumference of the active pillar pattern 335 by a preset distance, are etched.

Figure 3G:
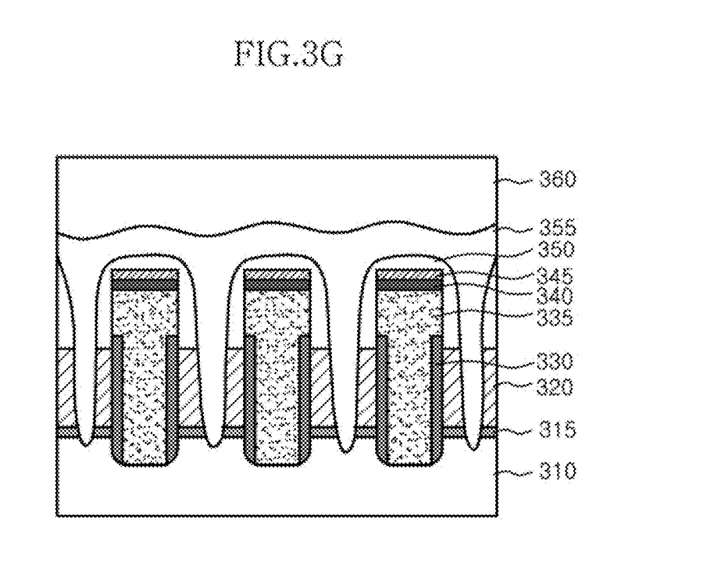

As illustrated in FIG. 3G, an insulating layer 355 for cell separation is formed on the semiconductor substrate, from which the portions of the spacer nitride material 350 and the gate electrode material 320 are etched, by a certain height, and a sacrificial layer 360 is formed on the insulating layer 355. The insulating layer 355 may be, for example, a nitride layer, and the sacrificial layer 360 may be, for example, a spin on dielectric (SOD) layer.

Figure 3H:
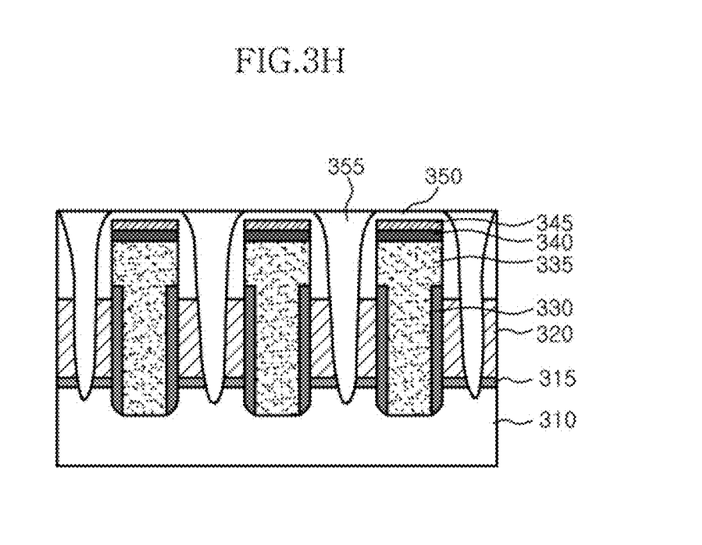

As illustrated in FIG. 3H, a portion of the insulating layer 355 and the sacrificial layer 360 are removed through a chemical mechanical polishing (CMP) process so that the insulating layer 355 is planarized.

The above embodiment of the present invention is illustrative and not limitative. Various alternatives and equivalents are possible. The invention is not limited by the embodiment described herein. Nor is the invention limited to any specific type of semiconductor apparatus. Other additions, subtractions, or modifications are obvious in view of the present disclosure and are intended to fall within the scope of the appended claims.

What is claimed is:

1. A method of fabricating a semiconductor apparatus, the method comprising:
   sequentially depositing a gate electrode material and a sacrificial insulating layer on a semiconductor substrate;
   patterning the gate electrode material and the sacrificial insulating layer to form one or more holes exposing a surface of the semiconductor substrate;
   forming a first gate insulating layer on an inner sidewall of the hole;
   forming one or more pillar patterns each filled in the hole and recessed on a top thereof;
   forming a contact unit and an electrode unit on the pillar pattern;
   removing a patterned sacrificial insulating layer and forming a spacer nitride material on the semiconductor substrate from which the patterned sacrificial insulating layer is removed; and
   removing portions of the spacer nitride material and a patterned gate electrode material between the pillar patterns.

2. The method of claim 1, further comprising:
   implanting ions into the semiconductor substrate, before the depositing of the gate electrode material and the sacrificial insulating layer.

3. The method of claim 2, wherein the pillar pattern is formed through an epitaxial growth method.

4. The method of claim 3, wherein the first gate insulating layer is formed on the inner sidewall of the hole corresponding to a sidewall of the patterned gate electrode material.

5. The method of claim 4, further comprising, after the removing of the portions of the spacer nitride material and the patterned gate electrode material:
   forming an insulating layer on the semiconductor substrate from which the portions of the spacer nitride material and the patterned gate electrode material are removed;
   forming a sacrificial layer on the insulating layer; and
   planarizing the insulating layer by removing a portion of the insulating layer and the sacrificial layer.

6. The method of claim 1, wherein the removing of the portions of the spacer nitride material and the patterned gate electrode material comprises:
   removing the portions of the spacer nitride material and the patterned gate electrode material spaced from an outer circumference of the pillar pattern.

7. The method of claim 1, further comprising:
   forming a second gate insulating layer on the semiconductor substrate, before the depositing of the gate electrode material and the sacrificial insulating layer,
   wherein the second gate insulating layer is patterned in the patterning of the gate electrode material, and the sacrificial insulating layer.

8. The method of claim 7, wherein the first gate insulating layer is formed of the same material as the second gate insulating layer.

9. The method of claim 8, wherein the pillar pattern is recessed in one of an X-line direction and a Y-line direction of the semiconductor substrate.

10. A method of fabricating a semiconductor apparatus, the method comprising:
    sequentially depositing a gate electrode material and an insulating layer on a semiconductor substrate;
    patterning the gate electrode material and the insulating layer to form one or more holes exposing a surface of the semiconductor substrate;
    forming a gate insulating layer on an inner sidewall of the hole;
    forming one or more pillar patterns each filled in the hole and recessed on a top thereof;
    forming a contact unit and an electrode unit on the pillar pattern;
    recessing the electrode unit and forming a data storage unit filled in the hole; and
    removing a portion of a patterned gate electrode material between the pillar patterns.

11. The method of claim 10, further comprising, after the forming of the data storage unit:
    removing a patterned insulating layer to expose an upper surface of the patterned gate electrode material; and
    forming a spacer nitride material on the upper surface of the patterned gate electrode material and a surface of a structure in which the pillar pattern, the contact unit, the electrode part, and the data storage unit are sequentially stacked.

12. The method of claim 11, wherein a portion of the spacer nitride material between the pillar patterns is removed in the removing of the portion of the patterned gate electrode material.

13. The method of claim 10, wherein the data storage unit includes one of a phase-change material, transition metal oxide, perovskite, and a polymer.

14. A semiconductor apparatus, comprising:
    a semiconductor substrate into which ions are implanted;
    one or more pillar patterns formed on and extending upward from the semiconductor substrate;
    a gate electrode material formed on an outer sidewall of the pillar pattern with a set height;
    a first gate insulating layer formed between the gate electrode material and the pillar pattern in a straight form; and
    a spacer nitride material formed on the gate electrode material to enclose the pillar pattern.

15. The semiconductor apparatus of claim 14, wherein the ions implanted into the semiconductor substrate are nitrogen ions.

16. The semiconductor apparatus of claim 14, wherein the plurality of pillar pattern is an epitaxially grown pillar pattern.

17. The semiconductor apparatus of claim 14, further comprising:
    a contact unit formed on the pillar pattern;
    an electrode unit formed on the contact unit; and
    a data storage unit formed on the electrode unit.

18. The semiconductor apparatus of claim 17, wherein the data storage unit includes one of a phase-change material, transition metal oxide, perovskite, and a polymer.

19. The semiconductor apparatus of claim 14, further comprising:
  a second gate insulating layer formed between the semiconductor substrate and the gate electrode material.

20. The semiconductor apparatus of claim 19, wherein the first gate insulating layer is formed of the same material as the second gate insulating layer.

\* \* \* \* \*